United States Patent
Yahav et al.

(10) Patent No.: US 10,211,803 B2
(45) Date of Patent: Feb. 19, 2019

(54) HIGH-PERFORMANCE CONVERSION BETWEEN SINGLE-ENDED AND DIFFERENTIAL/COMMON-MODE SIGNALS

(75) Inventors: Nir Yahav, Holon (IL); Ofer Rahmanony, Holon (IL)

(73) Assignee: Maxlinear Isreal Ltd. (IL)

( * ) Notice: Subject to any disclaimer, the term of this patent is extended or adjusted under 35 U.S.C. 154(b) by 2388 days.

(21) Appl. No.: 12/551,574

(22) Filed: Sep. 1, 2009

(65) Prior Publication Data

US 2011/0050359 A1  Mar. 3, 2011

(51) Int. Cl.
*H03H 7/38* (2006.01)
*H03H 7/42* (2006.01)

(52) U.S. Cl.
CPC ............... *H03H 7/42* (2013.01); *H03H 7/38* (2013.01)

(58) Field of Classification Search
CPC .......... H03H 7/38; H03H 7/42; H04B 17/327; H03D 7/14; H03D 7/1466
USPC .................................................. 455/323, 313
See application file for complete search history.

(56) References Cited

U.S. PATENT DOCUMENTS

| | | | | |
|---|---|---|---|---|
| 4,940,954 | A * | 7/1990 | Aubert et al. | 332/103 |
| 5,179,728 | A * | 1/1993 | Sowadski | 455/183.1 |
| 5,339,462 | A * | 8/1994 | Staudinger | H01L 23/66 333/118 |
| 6,738,611 | B1 * | 5/2004 | Politi | 455/302 |
| 7,020,452 | B1 * | 3/2006 | Kobayashi | H03D 9/0633 327/113 |
| 7,042,960 | B2 * | 5/2006 | Kintis | H03D 7/165 375/239 |
| 7,627,057 | B2 * | 12/2009 | McCune, Jr. | H03D 3/009 375/299 |
| 2002/0163375 | A1 * | 11/2002 | Wu | H01L 27/0617 327/356 |
| 2003/0119470 | A1 * | 6/2003 | Persico | 455/323 |
| 2004/0092245 | A1 * | 5/2004 | Katz | H03D 9/0633 455/326 |
| 2005/0272395 | A1 | 12/2005 | Sorrells et al. | |
| 2006/0186960 | A1 | 8/2006 | Diorio et al. | |

(Continued)

OTHER PUBLICATIONS

International Application PCT/IB2010/052071 Search Report dated Nov. 22, 2010.

(Continued)

*Primary Examiner* — Yuwen Pan
*Assistant Examiner* — Fatuma G Sherif
(74) *Attorney, Agent, or Firm* — McAndrews, Held & Malloy, Ltd.

(57) ABSTRACT

A signal conversion apparatus includes first and second input ports and first and second output ports. A first splitter is coupled to convert a first single-ended signal received on the first input port into a differential signal including first and second opposite-phase components, and to provide the first and second opposite-phase components respectively on the first and second output ports. A second splitter is separate from the first splitter and is coupled to convert a second single-ended signal received on the second input port into a common-mode signal including first and second in-phase components, and to provide the first and second in-phase components respectively on the first and second output ports together with the first and second opposite-phase components.

25 Claims, 3 Drawing Sheets

(56) References Cited

U.S. PATENT DOCUMENTS

2007/0105504 A1    5/2007    Vorenkamp et al.

OTHER PUBLICATIONS

Blount et al., "A High IP3, Subharmonically Pumped Mixer for LMDS Applications", 22nd Annual Gallium Arsenide Integrated Circuit (GaAs IC) Symposium, pp. 171-174, Seattle, USA, Nov. 5-8, 2000.
Choi et al., "Broadband uniplaner balanced subharmonic mixer", Electronics Letters Journal, vol. 41, issue 2, pp. 74-76, Jan. 20, 2005.
Hittie Microwave Corporation, "HMC 266, GaAs MMIC Sub-Harmonically Pumped Mixer, 20-40 GHz", Version 07.0907, USA Jan. 16, 2008.

* cited by examiner

HIGH-PERFORMANCE CONVERSION BETWEEN SINGLE-ENDED AND DIFFERENTIAL/COMMON-MODE SIGNALS

FIELD OF THE INVENTION

The present invention relates generally to analog signal processing, and particularly to methods and devices for conversion between single-ended signals and differential and common-mode signals.

BACKGROUND OF THE INVENTION

Electric signals may be routed in electronic circuits using various propagation modes or signal types, such as single-ended, differential and common-mode signals. A single-ended signal is typically transported over a single line or terminal, which is referenced to ground. A differential signal is typically transported over a pair of lines or terminals, such that the signal components carried by the two lines are offset by 180°. A common-mode signal is also carried by two lines or terminals, but the signal components in this case are aligned in phase and amplitude. Several types of circuits are known in the art for converting between single-ended signals and differential signals or common-mode signals.

SUMMARY OF THE INVENTION

An embodiment of the present invention provides a signal conversion apparatus, including first and second input ports and first and second output ports. A first splitter is coupled to convert a first single-ended signal received on the first input port into a differential signal including first and second opposite-phase components, and to provide the first and second opposite-phase components respectively on the first and second output ports. A second splitter is separate from the first splitter and is coupled to convert a second single-ended signal received on the second input port into a common-mode signal including first and second in-phase components, and to provide the first and second in-phase components respectively on the first and second output ports together with the first and second opposite-phase components.

In a disclosed embodiment, the first splitter includes a balanced-to-unbalanced (balun) splitter. Additionally or alternatively, the second splitter includes a power divider. The apparatus may include ancillary circuitry for isolating between the first and second splitters.

In some embodiments, the first and second splitters operate over respective, different first and second frequency bands. Typically, the first and second splitters are optimized over the respective first and second frequency bands independently of one another. Alternatively or additionally, the first splitter produces the opposite-phase components on respective splitter outputs, and the apparatus includes delay lines coupled to insert a delay, which is equivalent to a quarter-wavelength at the second frequency band, between the splitter outputs and the respective output ports. The delay lines may include coupled transmission lines or inductors and capacitors.

Additionally or alternatively, the second splitter produces the in-phase components on respective splitter outputs, and the apparatus includes delay lines coupled to insert a delay, which is equivalent to a quarter-wavelength at the first frequency band, between the splitter outputs and the respective output ports.

In a disclosed embodiment, the apparatus includes one or more transformers, which are connected between the splitters and the output ports and are coupled to isolate the differential signal and the common-mode signal from the first and second single-ended signals.

In another embodiment, the first splitter is coupled to convert opposite-phase components of third and fourth signals provided respectively on the first and second output ports into a third single-ended signal and to provide the third single-ended signal on the first input port, and the second splitter is coupled to convert in-phase components of third and fourth signals provided respectively on the first and second output ports into a fourth single-ended signal and to provide the fourth single-ended signal on the second input port. Typically, the opposite-phase components are derived from an Intermediate Frequency (IF) or baseband signal, wherein one of the third and fourth single-ended signals includes a Radio Frequency (RF) signal, and wherein the other of the third and fourth single-ended signals includes a Local Oscillator (LO) signal that is used to modify a frequency of the IF or baseband signal to produce the RF signal.

Typically, one of the single-ended signals includes a Radio Frequency (RF) signal, and the other of the single-ended signals includes a Local Oscillator (LO) signal, and the apparatus includes mixing circuitry, which is coupled to modify a frequency of the RF signal by mixing the differential signal with the common-mode signal.

There is also provided, in accordance with an embodiment of the present invention, a mixer, including a signal conversion unit, which includes first and second input ports, first and second output ports, and first and second splitters. The first splitter is coupled to convert a first single-ended signal received on the first input port into a differential signal including first and second opposite-phase components, and to provide the first and second opposite-phase components respectively on the first and second output ports. The second splitter is separate from the first splitter and is coupled to convert a second single-ended signal received on the second input port into a common-mode signal including first and second in-phase components, and to provide the first and second in-phase components respectively on the first and second output ports together with the first and second opposite-phase components. Mixing circuitry is coupled to modify a frequency of one of the single-ended signals by mixing the differential signal and the common-mode signal.

In a disclosed embodiment, the mixing circuitry is coupled to generate a harmonic of one of the differential signal and the common-mode signal, and to modify the frequency using the harmonic.

There is additionally provided, in accordance with an embodiment of the present invention, Radio Frequency Integrated Circuit (RFIC), including a semiconductor substrate and a signal conversion unit, as described above. In a disclosed embodiment, the RFIC includes mixing circuitry, which is fabricated on the semiconductor substrate and is coupled to modify a frequency of one of the single-ended signals by mixing the differential signal and the common-mode signal.

There is further provided, in accordance with an embodiment of the present invention, a signal conversion method, which includes using a first splitter to covert a first single-ended signal into a differential signal including first and second opposite-phase components. A second splitter that is separate from the first splitter, is used in converting a second single-ended signal into a common-mode signal including first and second in-phase components. The first opposite-phase component is provided together with the first in-phase component on a first port, and the second opposite-phase component is provided together with the second in-phase component on a second port.

The present invention will be more fully understood from the following detailed description of the embodiments thereof, taken together with the drawings in which:

DETAILED DESCRIPTION OF EMBODIMENTS

Overview

Embodiments of the present invention provide improved methods and devices for converting two single-ended signals (e.g., an RF signal and an LO signal) into a sum of a differential representation of one signal and a common-mode representation of the other signal. Some such embodiments can be used, for example, in mixing a differential Radio Frequency (RF) signal and a common-mode Local Oscillator (LO) signal. The disclosed configurations are usually bidirectional, i.e., can also be used for converting a sum of a differential signal and a common-mode signal into a pair of single-ended signals.

In the context of the present patent application, the term "single-ended signal" refers to any signal that is transported over a single line, port or terminal. Single-ended signals are typically referenced to ground. The term "differential signal" refers to any signal having two opposite-phase components (i.e., waveforms having a mutual phase offset of approximately 180° and substantially the same amplitude), which are transported over a pair of lines, ports or terminals. The term "common-mode signal" refers to any signal having two in-phase components (waveforms having a mutual phase offset of approximately 0° and substantially the same amplitude), which are transported over a pair of lines, ports or terminals.

In some embodiments, a signal converter comprises a first splitting circuit, which converts a first single-ended signal into a differential signal comprising two opposite-phase components, and outputs the opposite-phase components on respective first and second ports. A second splitting circuit converts a second single-ended signal into a common-mode signal comprising two in-phase components, and outputs the in-phase components respectively on the first and second ports together with the two opposite-phase components of the first signal. Unlike some known conversion schemes in which both single-ended signals are converted by the same device or circuit, the disclosed configurations process each single-ended signal using a separate splitting circuit.

In some embodiments, the signal converter comprises additional circuitry for isolating the splitting circuits from one another. Isolation may be carried out using transmission lines or transformers and inductors, for example. Thus, each splitting circuit can be designed and optimized (e.g., matched) for a certain frequency and bandwidth, irrespective of the other splitting circuit. As a result, the disclosed devices can process large-bandwidth signals that are widely separated from one another in frequency. Moreover, conversion of single ended signals to orthogonal signals enables high isolation between the signal converter ports.

Several example circuit configurations for implementing the first and second splitting circuits, and for isolating them from one another, are described herein. The disclosed techniques are particularly suitable for implementation using planar technology, e.g., in a RF Integrated Circuit (RFIC) or a Monolithic Microwave Integrated Circuit (MMIC).

Mixer Employing Single-Ended to Differential/Common-Mode Signal Conversion

Figure 1:
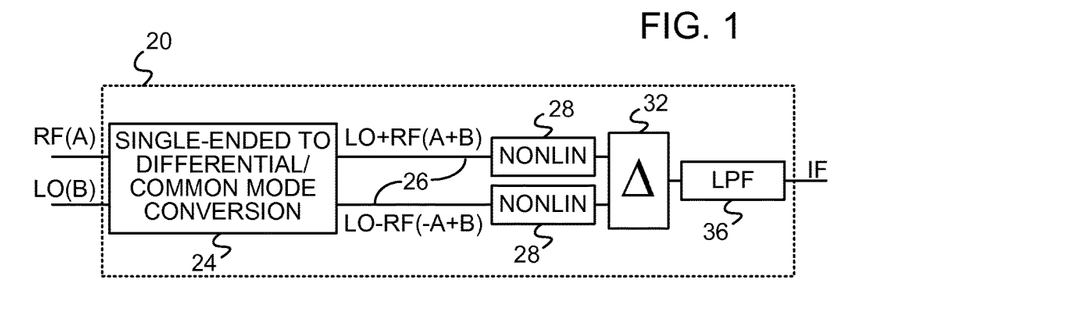
FIG. 1 is a block diagram that schematically illustrates a mixer, in accordance with an embodiment of the present invention.

FIG. 1 is a block diagram that schematically illustrates a mixer 20, in accordance with an embodiment of the present invention. In the description that follows, mixer 20 is regarded as a down-converting mixer that mixes an input Radio Frequency (RF) signal with an input Local Oscillator (LO) signal to produce an output Intermediate Frequency (IF) signal (or a baseband signal in direct conversion). However, mixer 20 may also be used as an up-converting mixer that mixes an input IF signal (or a baseband signal in direct conversion) with an input LO signal to produce an output RF signal.

Typically although not necessarily, mixer 20 comprises a sub-harmonic mixer in which the frequency of the output signal depends on a harmonic of at least one of the input signals, rather than on the fundamental frequencies of the input signals. In a sub-harmonic mixer, the frequencies of the RF and LO signals can be widely separated from one another.

On down-conversion, mixer 20 accepts as input a single-ended RF signal (also denoted A) and a single-ended LO signal (also denoted B). The mixer comprises a signal converter 24, which has two output ports. Converter 24 converts the single-ended RF signal (A) into a differential signal having two opposite-phase components (denoted A, −A), and outputs the two components over the respective output ports. Converter 24 also converts the single-ended LO signal (B) into a common-mode signal having two in-phase components (both denoted B). Converter 24 outputs the two in-phase components of the common-mode LO signal, together with the respective opposite-phase components of the differential RF signal, over the two ports. Thus, one of the ports carries a signal of the form A+B (LO+RF), while the other port carries a signal of the form −A+B (LO−RF).

Mixer 20 comprises two non-linear elements 28, which perform non-linear operations on the respective signals provided at ports 26 of converter 24. Thus, one non-linear element applies a non-linear operation to (LO+RF), whereas the other non-linear element applies substantially the same non-linear operation to (LO−RF). Note that the respective amplitudes of the RF and LO signals are substantially the same in the (LO+RF) signal and in the (LO−RF) signal. The inputs to non-linear elements 28 differ from one another only in the phase of the RF signal. Elements 28 may comprise, for example, diodes, transistors or any other suitable type of nonlinear elements.

A subtractor 32 subtracts the outputs of the two non-linear elements. A filter 36, typically a Low-Pass Filter (LPF), filters out undesired mixing products and harmonics and retains the desired mixing products. The IF signal produced by filter 36 is provided as output.

Several examples of circuitry that can be used to implement signal converter 24 are described below. Since the disclosed configurations enable independent design and optimization of the RF and LO processing within converter 24, mixer 20 can be designed to support large bandwidths for any desired ratio between the RF and LO frequencies. For example, a given mixer may support LO signals over the range 10-20 GHz and RF signals over the range 20-40 GHz. In alternative embodiments, any other suitable LO and RF frequency bands can also be used.

(The configuration of FIG. 1, in which RF=A and LO=B, is chosen arbitrarily. In an alternative embodiment, a configuration in which RF=B and LO=A can also be used. In the latter configuration, the signal converter produces signals of the form RF+LO and RF−LO. These signals can be used in a similar manner to perform mixing. In this configuration, subtractor 32 should be replaced by an adder.)

Example Signal Conversion Schemes

Figure 2:
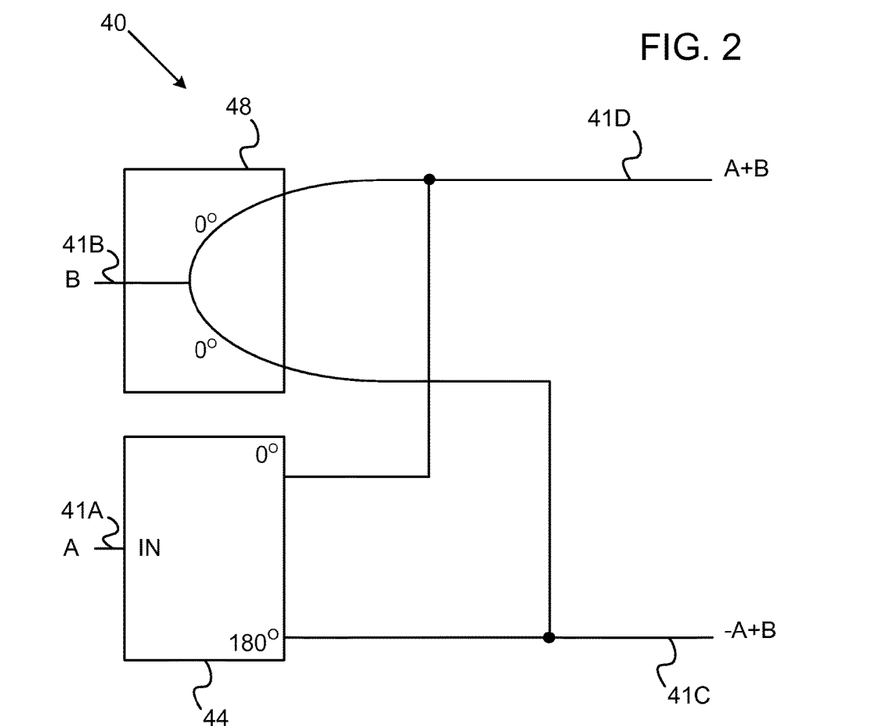
FIGS. 2-4 are circuit diagrams that schematically illustrate signal converters, in accordance with embodiments of the present invention.

FIG. 2 is a circuit diagram that schematically illustrates a signal converter 40, in accordance with an embodiment of the present invention. Converter 40 comprises a total of four ports, two input ports denoted 41A and 41B and two output ports denoted 41C and 41D. The converter accepts as input two single-ended signals denoted A and B. In the present example, signal A is input at port 41A and signal B is input at port 41B. Converter 40 produces a differential signal of the form (−A, A) and a common mode signal of the form (B, B) over ports 41C and 41D. In other words, a signal of the form A+B is output over port 41D, while a signal of the form −A+B is output over port 41C. The configuration of FIG. 2 can be used, for example, to implement signal converter 24 of FIG. 1.

Converter 40 comprises a 0°/180° splitter 44 (also referred to as a Balanced-to-Unbalanced (BALUN)), which converts single-ended signal A into two opposite-phase signal components (i.e., components having a 180° phase offset with respect to one another) denoted A, −A. Splitter 44 can be implemented using any suitable components, such as using a transformer, a Merchand BALUN or an active BALUN, as are known in the art.

Additionally, converter 40 comprises a 070° (in-phase) splitter 48, which converts single-ended signal B into two in-phase signal components (i.e., components having a 0° phase offset with respect to one another), both denoted B. Splitter 48 may comprise, for example, a resistor-based power divider, a Wilkinson divider, a T-junction divider, an active power splitter or any other suitable splitter type. Respective outputs of splitter 44 and splitter 48 are connected to one another, and to the converter ports 41C and 41D. For example, an upper output of the splitter 48 is connected to an upper output of the s splitter 44, and this connection functions as an exemplary adder for adding the signals on those respective splitter outputs (B from splitter 48 and A from splitter 44) to generate the A+B signal on the converter port 41D. Similarly, a lower output of the splitter 48 is connected to a lower output of the splitter 44, and this connection functions as an exemplary adder for adding the signals of those respective splitter outputs (B from splitter 48 and −A from splitter 44) to generate the A−B signal on the converter port 41C.

Splitters 44 and 48 may be implemented, for example, using discrete components and/or packaged devices, or they can be fabricated using transmission lines such as stripline or microstrip.

The description above, as well as the description of FIGS. 3 and 4 below, refers to the signal converter as converting two single-ended signals into a sum of a differential signal and a common-mode signal. The circuit configurations described herein, however, are typically bidirectional (assuming their building blocks are passive). In other words, the signal converters described herein can also be used to convert a sum of a differential signal and a common-mode signal (i.e., a signal A+B on one port and a signal −A+B on another port) into two separate single-ended signals (A and B)—as long as the BALUN and the in-phase power splitter are not implemented using active devices such as transistors.

As can be seen in FIG. 2, the circuitry that converts signal A into the differential representation (splitter 44) and the circuitry that converts signal B into the common-mode representation (splitter 48) are separate from one another. Thus, splitter 44 and splitter can be designed and optimized for the desired frequency and bandwidth of signals A and B independently of one another. In an example embodiment, the frequency of the LO signal (B) is approximately half of the frequency of the RF signal (A), and each of the signals has an octave bandwidth. Alternatively, any other suitable frequencies and bandwidths can also be chosen.

In some cases, however, mutual loading or other interaction may exist between splitters 44 and 48. For example, splitter 48 may create a short-circuit between the outputs of splitter 44. As another example, splitter 44 may short the outputs of splitter 48 to ground. This sort of interaction may degrade the performance of the signal converter. The amount of interaction may depend, for example, on the actual frequencies of signals A and B.

In alternative embodiments, the signal converter comprises circuitry that reduces the mutual interaction between the two splitters and decouples the output (differential and common-mode) signals from the single-ended input signals. Two example implementations are described in FIGS. 3 and 4 below.

Figure 3:
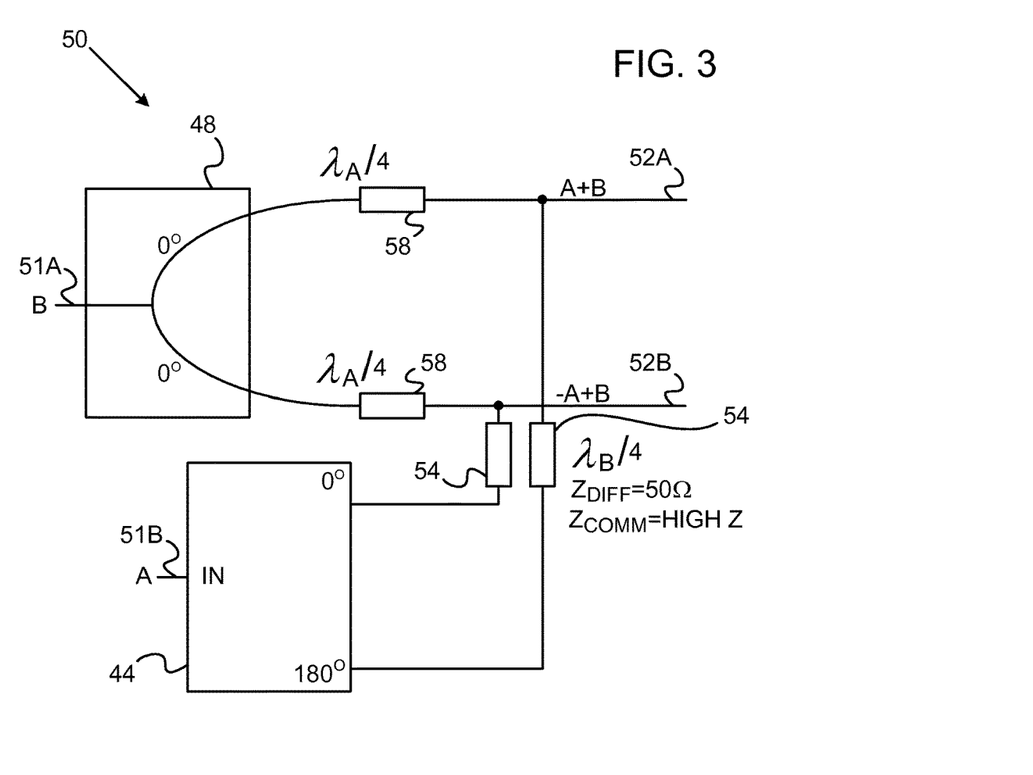

FIG. 3 is a circuit diagram that schematically illustrates a signal converter 50, in accordance with an alternative embodiment of the present invention. The configuration of FIG. 3 reduces the mutual interaction between splitters 44 and 48 using quarter-wavelength delay lines. Converter 50 has two input ports 51A and 51B, and two output ports 52A and 52B.

In order to prevent splitter 48 from creating a short between the outputs of splitter 44, each output of splitter 48 is followed by a respective delay line 58 before connecting to the respective output port of the signal converter. Each delay line 58 inserts a delay equivalent to $\lambda_A/4$, wherein $\lambda_A$ denotes the wavelength of signal A. For signals whose wavelength is in the vicinity of $\lambda_A$, the quarter-wavelength line transforms short-circuit conditions to open-circuit conditions.

In order to prevent splitter 44 from shorting the outputs of splitter 48 to ground, the outputs of splitter are followed by respective delay lines 54 before connecting to the respective output ports of the converter. Each delay line 54 inserts a delay equivalent to $\lambda_B/4$, wherein $\lambda_B$ denotes the wavelength of signal B. These quarter-wavelength delays transform short-circuit conditions to open-circuit conditions for signals whose wavelength is in the vicinity of $\lambda_B$. Delay lines 54 typically comprise coupled transmission lines, which exhibit high impedance to common-mode signals and are designed to have a characteristic impedance that is matched to splitter 44.

Delay lines 54 and 58 can be implemented using any suitable elements, such as using stripline or microstrip transmission lines.

Figure 4:
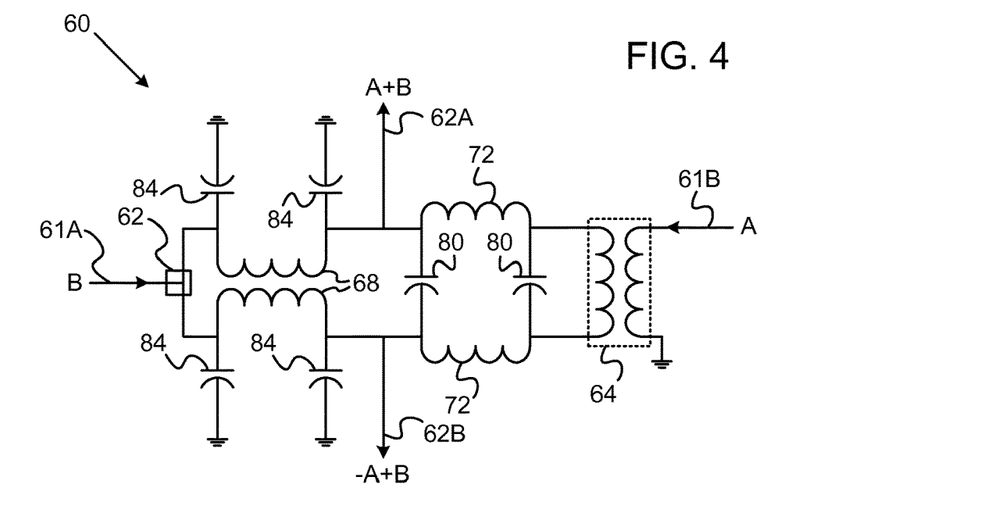

FIG. 4 is a circuit diagram that schematically illustrates a signal converter 60, in accordance with another embodiment of the present invention. Converter 60 has two input ports 61A and 61B, and two output ports 62A and 62B. The configuration of FIG. 4 uses inductors and capacitors to isolate the two signal splitting operations from one another. In signal converter 60, signal A is converted to a differential signal (−A, A) by a transformer 64. Signal B is converted to a common-mode signal (B, B) by a 0°/0° splitter 62. Signals A+B and −A+B are output over ports 62A and 62B, respectively.

Converter 60 comprises two inductor-capacitor networks, each comprising an inductor 68 that is connected to ground by two capacitors 84. The inductor-capacitor networks function as artificial $\lambda_A/4$ transmission lines, which follow the outputs of splitter before connecting to ports 62A and 62B. These artificial transmission lines prevent splitter 62 from creating a short between the outputs of transformer 64. Alternatively, the inductor-capacitor networks can be replaced by other suitable network topologies, such as High-Pass Filters (HPF), Band-Pass Filters (BPF) implemented using T-network or Pi-networks, for example.

Transformer 64 is followed by inductors 72, which exhibit high impedance. As such, inductors 72 prevent transformer 64 from shorting the outputs of splitter 62 to ground. Parallel capacitors 80 form artificial differential transmission lines with a characteristic impedance that matches the BALUN that is implemented by transformer 64. Since capacitors 80 have a small (e.g., 0V) voltage drop in common mode, they appear as open-circuit to common-mode signals.

The transformer and inductors of converter 60 can be implemented using any suitable elements, such as discrete components or packaged devices.

In some embodiments, elements of converter 60 (e.g., the inductor-capacitor networks and/or transformer 64) can be used as part of an impedance matching network, which matches ports 62A and 62B to other circuitry (e.g., to non-linear mixer elements 28 in FIG. 1 above). Similarly, elements of converter 50 of FIG. 3 above can be used as part of an impedance matching network that matches ports 52A and 52B to other circuitry.

Alternatively to the configurations of FIGS. 3 and 4, the signal converter may comprise any other suitable ancillary circuitry (e.g., specifically-designed filters) for isolating the splitting operations applied to single-ended signals A and B.

Example RFIC/MMIC Implementation

The signal converter configurations described herein are particularly suitable for fabrication using planar semiconductor technology, e.g., in a Radio Frequency Integrated Circuit (RFIC) or Monolithic Microwave Integrated Circuit (MMIC).

Figure 5:
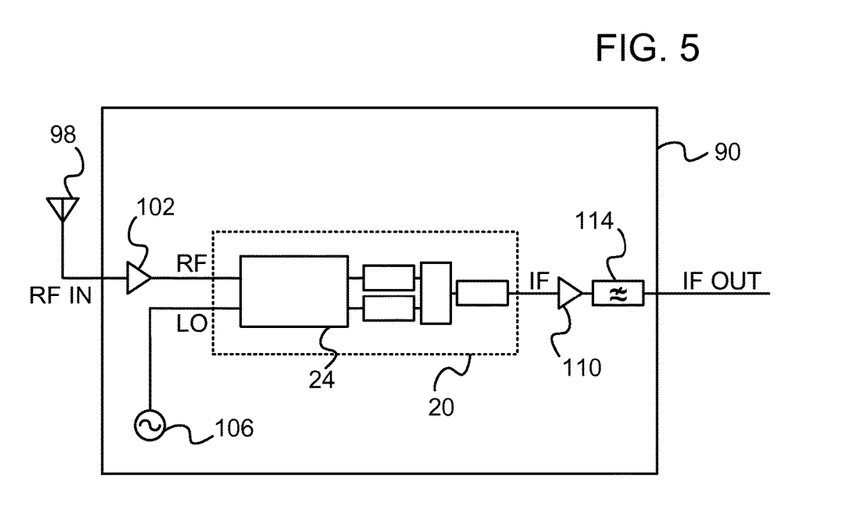
FIG. 5 is a block diagram that schematically illustrates Radio Frequency (RF) circuitry implemented in a Radio Frequency Integrated Circuit (RFIC) or Monolithic Microwave Integrated Circuit (MMIC), in accordance with an embodiment of the present invention.

FIG. 5 is a block diagram that schematically illustrates RF circuitry implemented in a RFIC or MMIC, in accordance with an embodiment of the present invention. The RFIC/MMIC of FIG. 5 comprises a semiconductor substrate 90, e.g., a silicon substrate, a Gallium Arsenide (GaAs) substrate or any other suitable substrate type.

In the present example, the RFIC comprises a down-converter that is based on mixer 20 of FIG. 1 above. The down-converter, and in particular mixer 20, is fabricated on substrate 90. The mixer comprises a signal converter 24, which can be implemented using any of the techniques described herein. In alternative embodiments, RFICs containing mixers of this sort may carry out up-conversion functions, as well. The RFIC configuration of FIG. 5 is a simplified example configuration, which was chosen purely for the sake of conceptual clarity. Any other suitable configuration can also be used.

The RFIC accepts an RF input signal from an antenna 98. The RF input signal is amplified by a Low-Noise Amplifier (LNA) 102 before entering mixer 20 as a single-ended signal. An LO generator 106 produces a LO signal for the down-conversion operation. (Alternatively, the RFIC may accept LO signals from external LO generation circuitry.) Mixer 20 mixes the single-ended RF and LO signals, as described above, to produce an IF signal. The IF signal is amplified by an IF amplifier 110, filtered by an IF filter 114, and provided as output.

Signal Conversion Method Description

Figure 6:
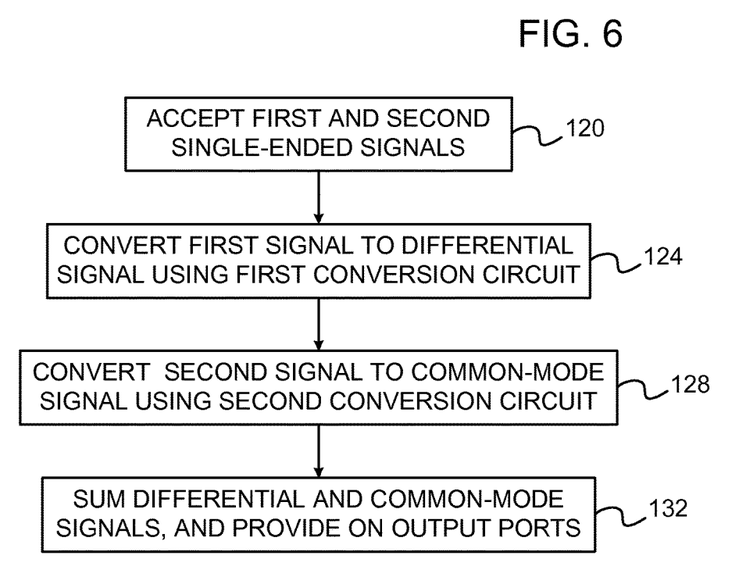
FIG. 6 is a flow chart that schematically illustrates a method for single-ended to differential/common-mode signal conversion, in accordance with an embodiment of the present invention.

FIG. 6 is a flow chart that schematically illustrates a method for single-ended to differential/common-mode signal conversion, in accordance with an embodiment of the present invention. The method of FIG. 6 begins with the signal converter (e.g., converter 24, 40, 50 or 60) accepting first and second single-ended signals, at an input step 120. The signal converter converts the first single-ended signal to a differential signal using a first conversion circuit, at a differential conversion step 124. In parallel, the signal converter converts the second single-ended signal to a common-mode signal using a second conversion circuit, which is separate from the first circuit, at a common-mode conversion step 128. The signal converter sums the differential and common-mode signals, and provides the sum over two output ports, at a summation and output step 132.

As noted above, the signal converter may operate in the opposite direction, as well. In other words, the signal converter may accept a sum of a differential signal and a common-mode signal, and convert the sum into two single-ended signals.

Although the embodiments described herein mainly address single-ended to differential/common-mode signal conversion in mixers, the methods and devices described herein can also be used to perform signal conversion in other components and applications, such as in RF circulators, isolators and duplexers. Such components may be fabricated in any suitable technology, such as in a RFIC, MMIC or MIC.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A signal conversion apparatus, comprising:
   first and second input ports;
   first and second output ports;
   a first splitter configured to convert a first single-ended signal received on the first input port into a differential signal comprising first and second opposite-phase components, wherein the first splitter is configured to provide the first and second opposite-phase components respectively on the first and second output ports, wherein the first splitter is configured to convert the first and second opposite-phase components into a third single-ended signal and to provide the third single-ended signal, and wherein the first and second opposite-phase components are derived from an Intermediate Frequency (IF) or baseband signal;

a second splitter, which is separate from the first splitter, configured to convert a second single-ended signal received on the second input port into a common-mode signal comprising first and second in-phase components, wherein the second splitter is configured to provide the first and second in-phase components respectively on the first and second output ports together with the first and second opposite-phase components, and wherein the second splitter is configured to convert the first and second in-phase components into a fourth single-ended signal and to provide the fourth single-ended signal, and wherein one of the third and fourth single-ended signals comprises a Radio Frequency (RF) signal, and wherein the other of the third and fourth single-ended signals comprises a Local Oscillator (LO) signal that is used to modify a frequency of the IF or baseband signal to produce the RF signal;

a first passive circuit coupled to the first splitter and configured to add a first delay to the first and second opposite-phase components, wherein the first delay is configured according to a frequency band comprising the second single-ended signal; and a second passive circuit coupled to the second splitter and configured to add a second delay to the first and second in-phase components, wherein the second delay is configured according to a frequency band comprising the first single-ended signal.

2. The apparatus according to claim 1, wherein the first splitter comprises a balanced-to-unbalanced (balun) splitter.

3. The apparatus according to claim 1, wherein the second splitter comprises a power divider.

4. The apparatus according to claim 1, comprising ancillary circuitry configured to isolate the first splitter from the second splitter.

5. The apparatus according to claim 1, wherein the first and second splitters operate over different respective first and second frequency bands.

6. The apparatus according to claim 1, comprising one or more transformers, which are connected between the splitters and the output ports and are configured to isolate the differential signal and the common-mode signal from the first and second single-ended signals.

7. The apparatus according to claim 1, wherein one of the single-ended signals comprises a Radio Frequency (RF) signal, and wherein the other of the single-ended signals comprises a Local Oscillator (LO) signal, and comprising mixing circuitry, which is coupled to modify a frequency of the RF signal by mixing the differential signal with the common-mode signal.

8. The apparatus according to claim 5, wherein the first and second splitters are optimized over the respective first and second frequency bands independently of one another.

9. The apparatus according to claim 5, wherein the first passive circuit comprises delay lines, and wherein the first delay is equivalent to a quarter-wavelength in the second frequency band.

10. The apparatus according to claim 5, wherein the second passive circuit comprises delay lines, and wherein the second delay is equivalent to a quarter-wavelength in the first frequency band.

11. The apparatus according to claim 9, wherein the delay lines comprise coupled transmission lines.

12. The apparatus according to claim 9, wherein the delay lines comprise inductors and capacitors.

13. The apparatus according to claim 10, wherein the delay lines comprise transmission lines.

14. The apparatus according to claim 10, wherein the delay lines comprise inductors and capacitors.

15. A mixer, comprising:
a signal conversion unit, comprising:
first and second input ports;
first and second output ports;
a first splitter, which is configured to convert a first single-ended signal received on the first input port into a differential signal comprising first and second opposite-phase components, and to provide the first and second opposite-phase components respectively on the first and second output ports, wherein the first splitter is configured to convert the first and second opposite-phase components into a third single-ended signal and to provide the third single-ended signal, and wherein the first and second opposite-phase components are derived from an Intermediate Frequency (IF) or baseband signal;
a second splitter, which is separate from the first splitter, and is configured to convert a second single-ended signal received on the second input port into a common-mode signal comprising first and second in-phase components, and to provide the first and second in-phase components respectively on the first and second output ports together with the first and second opposite-phase components, and wherein the second splitter is configured to convert the first and second in-phase components into a fourth single-ended signal and to provide the fourth single-ended signal, and wherein one of the third and fourth single-ended signals comprises a Radio Frequency (RF) signal, and wherein the other of the third and fourth single-ended signals comprises a Local Oscillator (LO) signal that is used to modify a frequency of the IF or baseband signal to produce the RF signal;
a first passive circuit configured to add a first delay to the first and second opposite-phase components, wherein the first delay is configured according to a frequency band comprising the second single-ended signal; and
a second passive circuit configured to add second delay to the first and second in-phase components, wherein the second delay is configured according to a frequency band comprising the first single-ended signal; and
mixing circuitry, which is coupled to combine the result on the first output port with the result on the second output port.

16. A Radio Frequency Integrated Circuit (RFIC), comprising:
a semiconductor substrate; and
a signal conversion unit, which is fabricated on the semiconductor substrate the signal conversion unit comprising:
first and second input ports;
first and second output ports;
a first splitter, which is configured to convert a first single-ended signal received on the first input port into a differential signal comprising first and second opposite-phase components, and to provide the first and second opposite-phase components respectively on the first and second output ports, wherein the first splitter is configured to convert the first and second opposite-phase components into a third single-ended signal and to provide the third single-ended signal, and wherein the first and second opposite-phase components are derived from an Intermediate Frequency (IF) or baseband signal; and
a second splitter, which is separate from the first splitter, and is configured to convert a second single-ended signal received on the second input port into a common-mode signal comprising first and second in-phase components, and to provide the first and second in-phase components respectively on the first and second output ports together with the first and second opposite-phase components, and wherein the second splitter is configured to convert the first and second in-phase components into a fourth single-ended signal and to provide the fourth single-ended signal, and wherein one of the third and fourth single-ended signals comprises a Radio Frequency (RF) signal, and wherein the other of the third and fourth single-ended signals comprises a Local Oscillator (LO) signal that is used to modify a frequency of the IF or baseband signal to produce the RF signal;
a first passive circuit configured to add a first delay to the first and second opposite-phase components, wherein the first delay is configured according to a frequency band comprising the second single-ended signal; and
a second passive circuit configured to add a second delay to the first and second in-phase components, wherein the second delay is configured according to a frequency band comprising the first single-ended signal.

17. The RFIC according to claim 16, and comprising mixing circuitry, which is fabricated on the semiconductor substrate and is coupled to combine the result on the first output port with the result on the second output port.

18. A signal conversion method, comprising:
using a first splitter, converting a first single-ended signal into a differential signal comprising first and second opposite-phase components, wherein the first splitter is configured to convert the first and second opposite-phase components into a third single-ended signal and to provide the third single-ended signal, and wherein the first and second opposite-phase components are derived from an Intermediate Frequency (IF) or baseband signal;
using a second splitter that is separate from the first splitter, converting a second single-ended signal into a common-mode signal comprising first and second in-phase components, and wherein the second splitter is configured to convert the first and second in-phase components into a fourth single-ended signal and to provide the fourth single-ended signal, and wherein one of the third and fourth single-ended signals comprises a Radio Frequency (RF) signal, and wherein the other of the third and fourth single-ended signals comprises a Local Oscillator (LO) signal that is used to modify a frequency of the IF or baseband signal to produce the RF signal;
delaying the first and second opposite-phase components by a first delay, wherein the first delay is configured according to a frequency band comprising the second single-ended signal;
delaying the first and second in-phase components by a second delay, wherein the second delay is configured according to a frequency band comprising the first single-ended signal;
providing a sum of a harmonic of the delayed first opposite-phase component and the delayed first in-phase component on a first port; and
providing a sum of a harmonic of the delayed second opposite-phase component and the delayed second in-phase component on a second port, wherein the harmonic of the second opposite-phase component is at a different frequency than the second opposite-phase component.

19. The method according to claim 18, wherein the first splitter comprises a balanced-to-unbalanced (balun) splitter.

20. The method according to claim 18, wherein the second splitter comprises a power divider.

21. The method according to claim 18, comprising isolating the first splitter from the second splitter using ancillary circuitry.

22. The method according to claim 18, wherein the first and second splitters operate over different respective first and second frequency bands.

23. The method according to claim 18, wherein one of the single-ended signals comprises a Radio Frequency (RF) signal, and
wherein the other of the single-ended signals comprises a Local Oscillator (LO) signal,
the method comprising modifying a frequency of the RF signal by mixing the differential signal with the common-mode signal.

24. The method according to claim 18, wherein one of the single-ended signals comprises a Radio Frequency (RF) signal,
wherein the other of the single-ended signals comprises a Local Oscillator (LO) signal, and comprising mixing an Intermediate Frequency (IF) or baseband signal with the LO signal to produce the RF signal.

25. The method according to claim 22, wherein the first and second splitters are optimized over the respective first and second frequency bands independently of one another.

* * * * *